ly connected to the chassis and the
other end free of the chassis. The belt loops extend
around the components and clamp them to the heatsink
through openings in the chassis. A screw extends
through a hole in the free end of each belt loop and
through a registering hole in the heatsink to secure the
free end to the heatsink.

United States Patent [19]

Selby et al.

[11] Patent Number: 5,190,097
[45] Date of Patent: Mar. 2, 1993

[54] INTEGRATED CLAMPING DEVICE FOR COMPONENT HEATSINKING

[76] Inventors: Steven F. Selby, 10315 Temperance;
Frank H. Klein, 10020 Westleigh Dr.,
both of Huntsville, Ala. 35803;
Dewayne E. Green, 322 Wildwood
Trace, Winchester, Tenn. 37398

[21] Appl. No.: 894,972

[22] Filed: Jun. 8, 1992

[51] Int. Cl.⁵ .......................... F28F 7/00; H02B 1/56
[52] U.S. Cl. .................................. 165/80.2; 165/80.3;
361/388; 361/389
[58] Field of Search .................... 361/386, 388, 389;
165/80.1, 80.2, 80.3; 174/16.3

[56] References Cited

U.S. PATENT DOCUMENTS

| | | | |
|---|---|---|---|
| 2,772,382 | 11/1956 | Escoffery | 361/388 |
| 2,881,364 | 4/1959 | Demer et al. | 361/386 |
| 2,888,228 | 5/1959 | Jarvis | 165/80.3 |
| 3,059,184 | 10/1962 | Germain | 361/389 |
| 3,316,454 | 4/1967 | Donath et al. | 361/389 |
| 4,007,402 | 2/1977 | Allport | 361/388 |
| 4,858,071 | 8/1989 | Manabe et al. | 361/388 |
| 4,872,102 | 10/1989 | Getter | 361/388 |
| 5,045,971 | 9/1991 | Ono et al. | 361/388 |

Primary Examiner—John Rivell
Assistant Examiner—L. R. Leo
Attorney, Agent, or Firm—Edward A. Craig

[57] ABSTRACT

A heatsinking arrangement for a heat-generating component of a car radio, tape cassette or the like. A heatsink is connected to the chassis. The components are secured in place on the chassis by belt loops each having one end integrally connected to the chassis and the other end free of the chassis. The belt loops extend around the components and clamp them to the heatsink through openings in the chassis. A screw extends through a hole in the free end of each belt loop and through a registering hole in the heatsink to secure the free end to the heatsink.

9 Claims, 2 Drawing Sheets

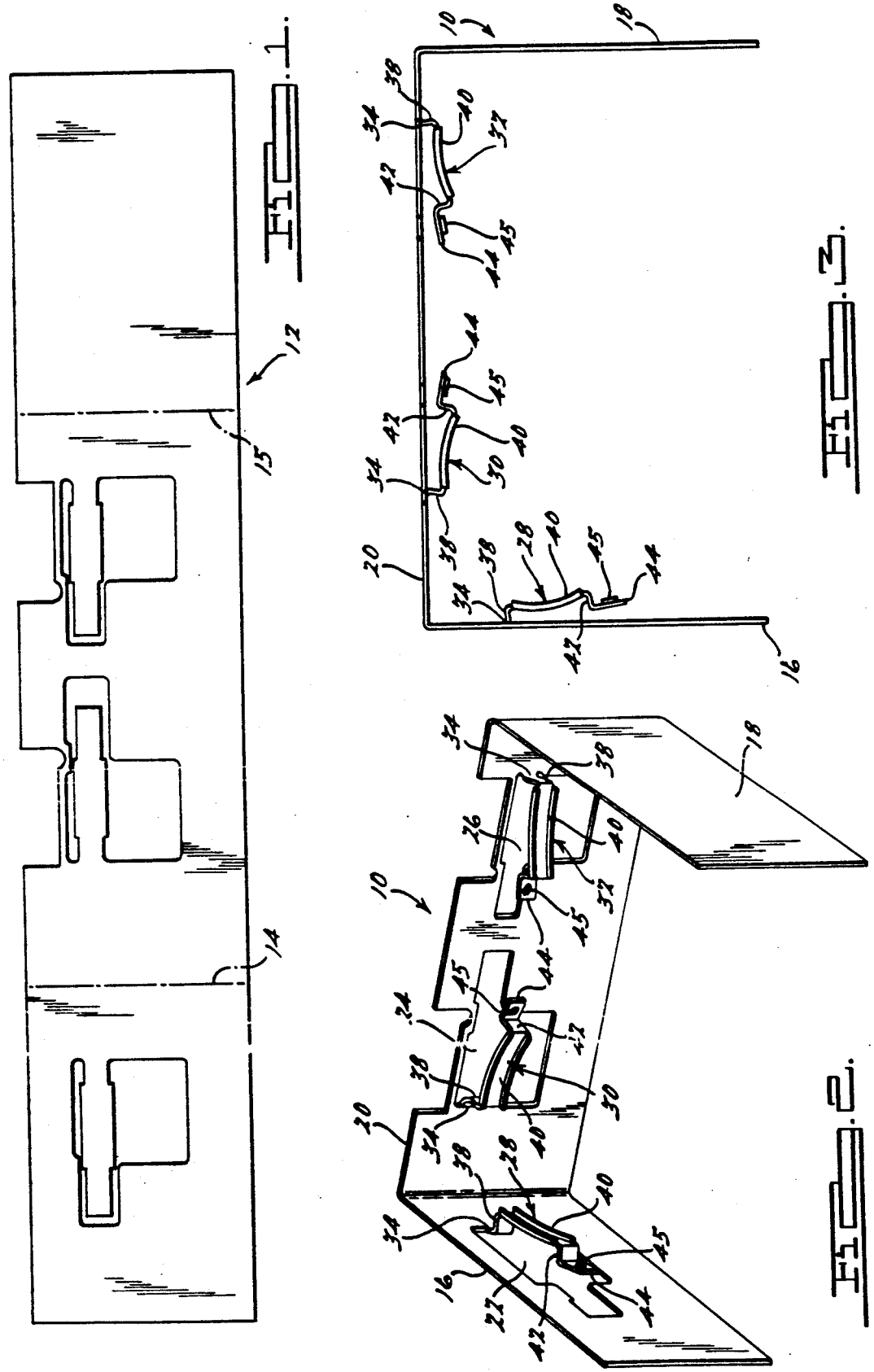

INTEGRATED CLAMPING DEVICE FOR COMPONENT HEATSINKING

This invention relates generally to heatsinking, and refers more particularly to a clamping device for the heatsinking of a heat-generating component of an instrument such as a car radio, tape cassette or the like.

BACKGROUND AND SUMMARY

Radios, tape cassettes and like instruments have components which become hot during use. These components may, for example, be voltage regulators and audio integrated circuits. The heat generated by these components must be extracted to prevent them from overheating and self-destructing. The common way of doing this is to clamp the components directly to a heatsink surface so that there will be good heat conductivity. The clamps that have been used in the past are parts which are separate from the rest of the assembly. The use of separate parts results in an increased cost of materials and an increase in assembly time.

One object of this invention is to provide for the heatsinking of a heat-generating component without the disadvantages encountered heretofore, and more specifically, to provide clamps which are formed integrally with the component chassis. This eliminates the need for separate parts and also reduces assembly time.

It is a further object to provide a clamping device for a heat-generating component which is relatively inexpensive, rugged and durable, and easy to manufacture and assemble.

Other objects, features and advantages will become more apparent as the following description proceeds, especially when considered with the accompanying drawings:

BRIEF DESCRIPTION OF THE DRAWINGS

FIG. 1 is an elevational view of an elongated plate or strip from which the chassis of a radio may be formed.

FIG. 2 is a perspective view of a radio chassis stamped from the plate of FIG. 1 in accordance with the invention.

FIG. 3 is a top plan view of the chassis shown in FIG. 2.

DETAILED DESCRIPTION

Figure 4:
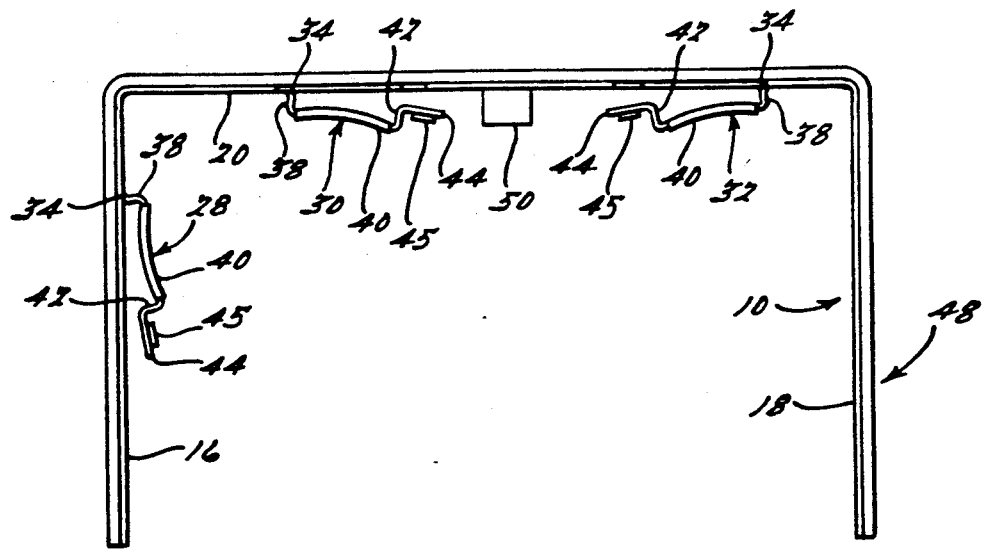
FIG. 4 is a top plan view of the chassis with a heatsink secured to the outer side of the chassis, in accordance with the invention.
Figure 5:
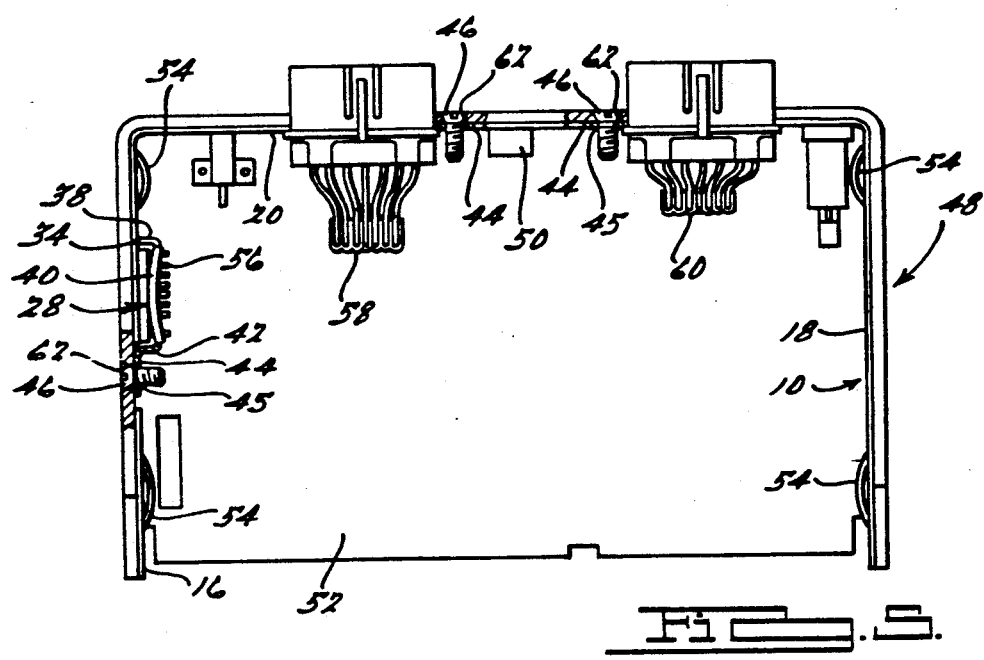
FIG. 5 is a top plan view similar to FIG. 4, but showing in addition a circuit board received in the chassis with heat-generating components of the circuit board clamped in place, in accordance with the invention.
Figure 6:
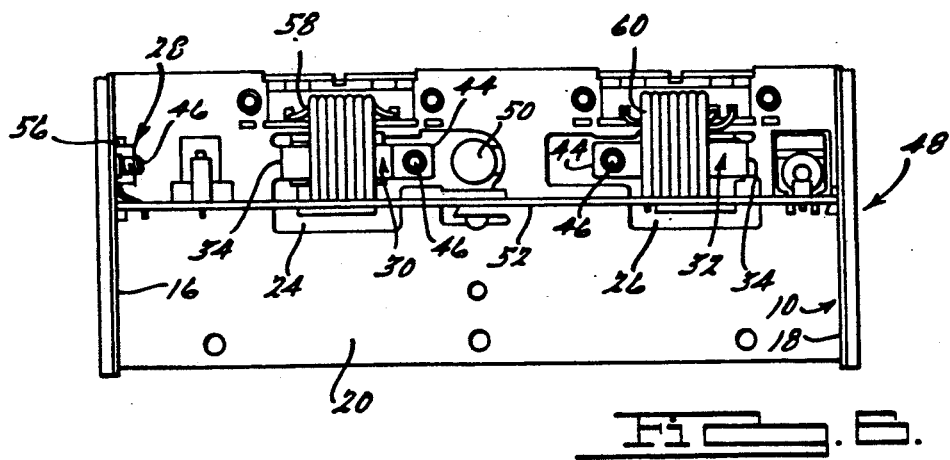
FIG. 6 is a front elevation of the structure shown in FIG. 5.

Referring now more particularly to the drawings, the chassis 10 is the chassis of a car radio or tape cassette or the like and is preferably made from a single flat strip 12 of spring steel (see FIG. 1) by stamping. The strip 12 after stamping is folded along the lines 14, 15 to form the chassis 10 shown in FIGS. 2 and 3.

The chassis 10 is generally channel-shaped and has side walls 16 and 18 integrally connected by a rear wall 20. The side wall 16 and rear wall 20 have openings 22, 24 and 26. Extending across these respective openings are clamps 28, 30 and 32. These openings and clamps are formed during the stamping of the flat strip 12.

The clamps are in the form of elongated spring-like flexible elements or tabs, often referred to as belt loops, having one end integrally connected at 34 to the chassis at one side of each opening and the other end free of the chassis.

Preferably, each belt loop has a relatively short leg 38 extending away from the associated opening 22, 24 or 26 interiorly of the chassis and terminating therewithin, being generally perpendicular to the chassis wall. An elongated bridge 40 has one end integrally connected to the interior termination point of leg 38 and extends generally perpendicular to leg 38 across the associated opening 22, 24 or 26. A second relatively short leg 42 is integrally connected to the opposite end of bridge 40 and extends toward the opening and is substantially perpendicular to bridge 40. Leg 42 terminates in a right angle foot 44 at the free end of the belt loop. A hole 45 is provided in foot 44 to receive a fastener such as a screw 46.

A heatsink in the form of a plate-like frame 48 is of substantially the same channel shape as chassis 10. The heatsink frame 48 is disposed over the outer side of the chassis with its side and end walls in substantial contact with the side and end walls of the chassis. The heatsink frame 48 is formed of a material having relatively high heat conductivity, such as aluminum or copper, and has its rear wall connected to the rear wall of the chassis as by the fastener 50 or by heat staking.

A circuit board 52, preferably generally rectangular in configuration, is fitted in the chassis on the inner side thereof and held in place by clips 54. The circuit board has heat-generating components 56, 58 and 60 which may, for example, be voltage regulators or audio integrated circuits. The components are on the inner side of the chassis and are clamped to the chassis by the belt loops 28, 30 and 32. The belt loops extend around the components. The free ends of the belt loops are secured to the heatsink frame 48 by the screws 46. Screws 46 extend through the holes 45 in the free ends of the belt loops and through registering holes 62 in the heatsink frame. The arrangement is such that the screws 46 can be installed from the outer side of the heatsink frame 48, to facilitate assembly.

When the components are secured in position by the belt loops, they make direct surface-to-surface contact with the heatsink frame through the openings 22, 24 and 26.

What is claimed is:

1. A heatsinking arrangement for a heat-generating component of an instrument such as a radio having a chassis, comprising a heatsink connected to said chassis, and mounting means for said component comprising an elongated clamp having one end integrally joined to said chassis and the opposite end free of said chassis, said clamp being adapted to clamp said component against said heatsink in direct surface-to-surface contact therewith, and means for securing said opposite end of said clamp to said heatsink.

2. A combination according to claim 1, wherein said chassis and clamp are formed from a single plate.

3. A combination according to claim 1, wherein said securing means comprises a fastener.

4. A combination according to claim 3, wherein said opposite end of said clamp has a fastener opening receiving said fastener.

5. A combination according to claim 1, wherein said chassis is formed from a plate by stamping and said clamp is formed from said plate during the stamping process.

6. A combination according to claim 3, wherein said chassis has an opening and said clamp extends over said opening, said component when clamped by said clamp contacting said heatsink through said opening.

7. A combination according to claim 1, wherein said chassis is formed from a single plate by stamping and said clamp is a flexible belt loop formed integrally with said chassis from said plate during the stamping process, said heatsink is in the form of a frame disposed over the outer side of said chassis and said component is disposed on the inner side of said chassis, said chassis has an opening and said belt loop extends across said opening, said component when clamped by said belt loop contacting said heatsink frame through said opening.

8. A combination according to claim 7, wherein said clamp comprises a first relatively short leg extending away from said opening internally of the chassis and terminating therewithin, an elongated bridge extending from the interior termination point of the first leg, a second relatively short leg extending from the bridge towards said opening and terminating in a free end, a foot extending from said free end, and a fastener, said foot having a first fastener opening therein, said heatsink having a second fastener opening therein, said first and second fastener openings adapted to receive said fastener to thereby secure the foot to the heatsink.

9. A combination according to claim 8, wherein said fastener is insertable in said first and second fastener openings from the outer side of said heatsink frame exteriorly of said chassis.

* * * * *

UNITED STATES PATENT AND TRADEMARK OFFICE
CERTIFICATE OF CORRECTION

PATENT NO. : 5,190,097
DATED : March 2, 1993
INVENTOR(S) : Selby, et al

It is certified that error appears in the above-indentified patent and that said Letters Patent is hereby corrected as shown below:

ON THE TITLE PAGE, in Assignee item #73, insert --Chrysler Corporation--

Signed and Sealed this

Fifth Day of July, 1994

Attest:

BRUCE LEHMAN

*Attesting Officer*        *Commissioner of Patents and Trademarks*